(12) United States Patent
Hamaguchi (10) Patent No.: US 10,937,737 B2
(45) Date of Patent: Mar. 2, 2021

(54) WIRING MEMBER AND POWER CONVERSION DEVICE

(71) Applicant: Mitsubishi Electric Corporation, Tokyo (JP)

(72) Inventor: Ryota Hamaguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/611,083

(22) PCT Filed: May 15, 2017

(86) PCT No.: PCT/JP2017/018212
§ 371 (c)(1),
(2) Date: Nov. 5, 2019

(87) PCT Pub. No.: WO2018/211562
PCT Pub. Date: Nov. 22, 2018

(65) Prior Publication Data
US 2020/0152575 A1     May 14, 2020

(51) Int. Cl.
*H01L 23/538*     (2006.01)
*H01L 25/18*     (2006.01)
(Continued)

(52) U.S. Cl.
CPC .......... *H01L 23/5386* (2013.01); *H01L 25/18* (2013.01); *H02M 7/003* (2013.01); *H02M 7/53871* (2013.01); *H02P 27/08* (2013.01)

(58) Field of Classification Search
CPC .... H01L 23/5386; H01L 25/18; H02M 7/003; H02M 7/53871; H01P 27/08
(Continued)

(56) References Cited

U.S. PATENT DOCUMENTS

2012/0001227 A1   1/2012   Takahashi et al.
2013/0322141 A1*   12/2013   Kobayashi ............ H02M 7/003
                                                                              363/123

FOREIGN PATENT DOCUMENTS

JP     2012005301 A    1/2012
JP     2013090529 A    5/2013
(Continued)

OTHER PUBLICATIONS

IEC60077-1 "Railway applications—Electric equipment for rolling stock—Part 1: General service conditions and general rules", pp. 51-63.

(Continued)

*Primary Examiner* — Tong-Ho Kim
(74) *Attorney, Agent, or Firm* — Buchanan Ingersoll & Rooney PC (57) ABSTRACT

A wiring member to electrically connect a positive direct-current terminal and an alternating-current terminal to each other, the positive direct-current terminal being formed in a semiconductor element module, the alternating-current terminal being formed in a semiconductor element module, a positive potential being applied to the positive direct-current terminal, a positive potential and a negative potential being appropriately applied to the alternating-current terminal, the wiring member including an insulative partition formed on the wiring member, the insulative partition being upright so as to block the line of sight between the positive direct-current terminal and the alternating-current terminal.

16 Claims, 7 Drawing Sheets

(51) Int. Cl.
*H02M 7/00* (2006.01)
*H02M 7/5387* (2007.01)
*H02P 27/08* (2006.01)

(58) Field of Classification Search
USPC .......................................................... 257/668
See application file for complete search history.

(56) References Cited

FOREIGN PATENT DOCUMENTS

| | | |
|---|---|---|
| JP | 2014036509 A | 2/2014 |
| WO | 2012108048 A1 | 8/2012 |

OTHER PUBLICATIONS

International Search Report (PCT/ISA/210), with translation, and Written Opinion (PCT/ISA/237) dated Aug. 1, 2017, by the Japan Patent Office as the International Searching Authority for International Application No. PCT/JP2017/018212.
Office Action dated Aug. 29, 2020, issued in corresponding Indian Patent Application No. 201927043549, 5 pages.

\* cited by examiner

(12) United States Patent

WIRING MEMBER AND POWER CONVERSION DEVICE

FIELD

The present invention relates to a wiring member for electrically connecting semiconductor element modules to one another, and also relates to a power conversion device using the wiring member.

BACKGROUND

Patent Literature 1 below discloses a power conversion device having semiconductor element modules electrically connected to one another by a busbar.

Patent Literature 2 below discloses a package-structure semiconductor element module having plural sets of semiconductor switching elements incorporated in a mold case. For the semiconductor element module, control terminals are located on a terminal block portion formed at side edge of the mold case. A ribbed insulative partition is formed on the terminal block portion. The ribbed insulative partition stands upright between the adjacent control terminal groups each corresponding to the set of semiconductor switching elements. The height and thickness dimensions of the insulative partition is set in compliance with the spatial distance defined in the international standards (hereinafter, appropriately referred to as "IEC60077-1") described below as Non Patent Literature 1.

CITATION LIST

Patent Literatures

Patent Literature 1: International Publication No. WO2012/108048
Patent Literature 2: Japanese Patent Application Laid-open No. 2012-5301

Non Patent Literature

Non Patent Literature 1: IEC60077-1 "Railway applications—Electric equipment for rolling stock—Part 1: General service conditions and general rules"

SUMMARY

Technical Problem

The technique disclosed in Patent Literature 2 described above is effective in downsizing the semiconductor element module itself. However, this technique does not contribute to a reduction in the distance between the main terminals of the semiconductor element modules. In a case where a power conversion device is configured using a plurality of semiconductor element modules, it is necessary to provide an insulation distance between the semiconductor element modules, which distance is a spatial distance corresponding to a voltage that can be applied to the main terminals. For this reason, the insulation distance between the main terminals of the semiconductor element modules is a bottleneck in determining the size of the power conversion device. Consequently, the distance between the semiconductor element modules cannot be shorter than the insulation distance, which places a constraint on downsizing of the power conversion device.

The present invention has been achieved to solve the above problems, and an object of the present invention is to provide a wiring member that can make the distance between main terminals of semiconductor element modules shorter than an insulation distance.

Solution to Problem

In order to solve the above problems and achieve the object, the present invention provides a wiring member to electrically connect a first main terminal and a second main terminal to each other, the first main terminal being formed in a first semiconductor element module, the second main terminal being formed in a second semiconductor element module, a first potential being applied to the first main terminal, a second potential being applied to the second main terminal, the second potential being different from the first potential. The wiring member comprises an insulative partition formed on the wiring member, the insulative partition being upright so as to block a line of sight between the first main terminal and the second main terminal.

Advantageous Effects of Invention

According to the present invention, there is an effect that a power conversion device can be downsized because the distance between the main terminals of the semiconductor element modules can be shorter than the insulation distance.

DESCRIPTION OF EMBODIMENTS

A wiring member and a power conversion device according to embodiments of the present invention will be described in detail below with reference to the accompanying drawings. The present invention is not limited to the embodiments. In the embodiments described below, a power conversion device for driving a railway vehicle is described as an example. However, this does not intend to exclude the application to other usages. In the accompanying drawings, the scale of each member is sometimes different from the actual scale for the sake of easy understanding. The scale is also different between the drawings.

First Embodiment

Figure 1:
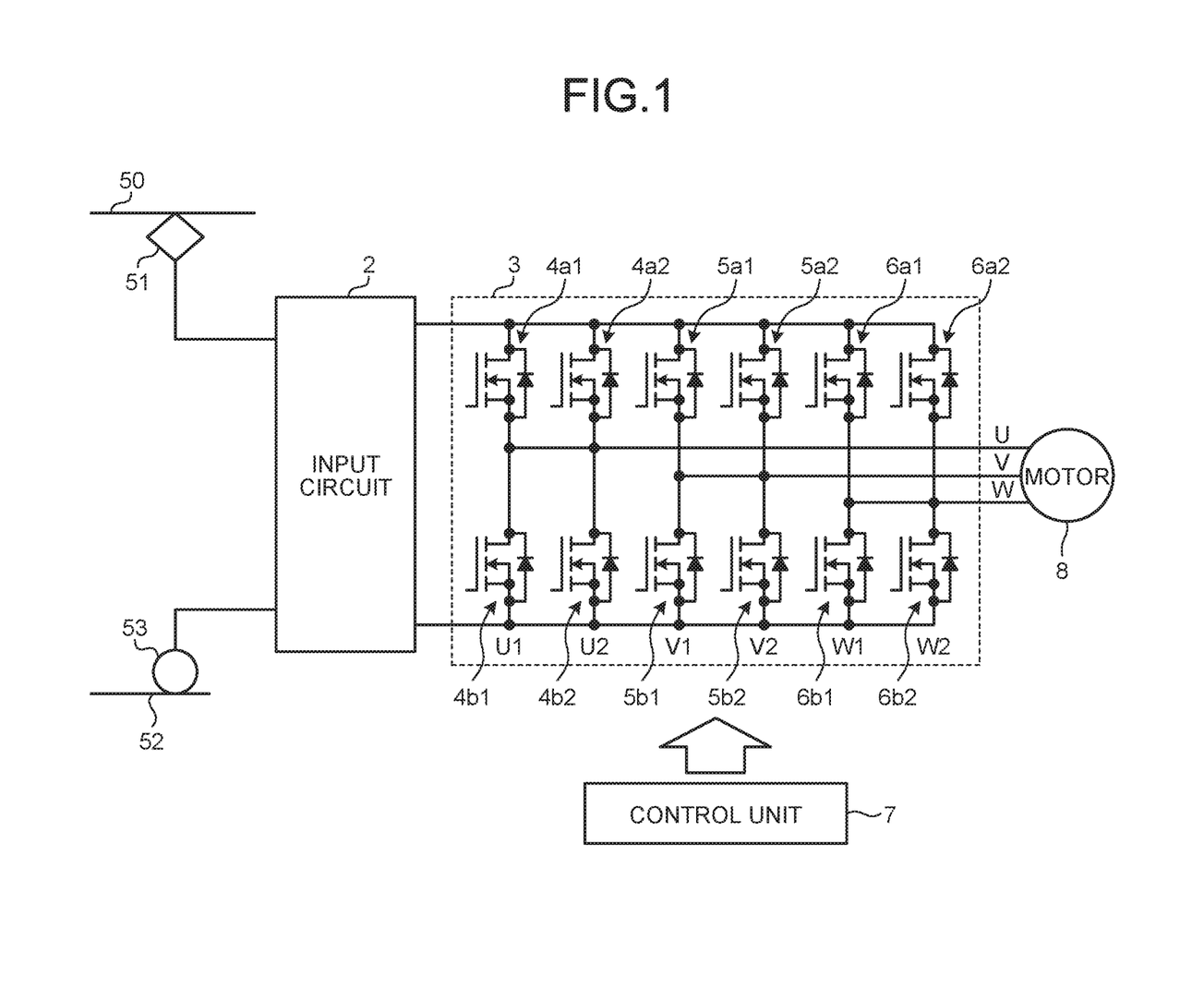
FIG. 1 is a circuit diagram illustrating an example configuration of a power conversion device according to a first embodiment.
Figure 2:
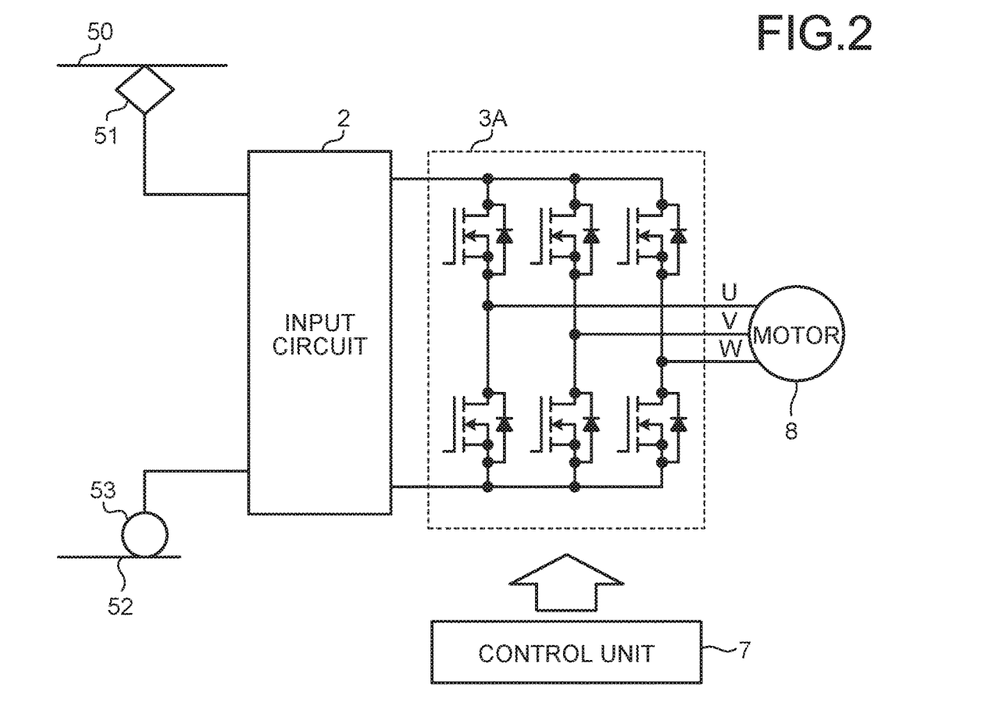
FIG. 2 is a circuit diagram illustrating another example configuration of the power conversion device according to the first embodiment.

FIG. 1 is a circuit diagram illustrating an example configuration of a power conversion device according to a first embodiment. FIG. 2 is a circuit diagram illustrating another example configuration of the power conversion device according to the first embodiment.

In FIG. 1, the power conversion device according to the first embodiment includes an input circuit 2 an inverter circuit 3, and a control unit 7. The input circuit 2 includes at least a switch, a filter capacitor, and a filter reactor. The inverter circuit 3 is provided with switching elements 4$a$1, 4$a$2, 5$a$1, 5$a$2, 6$a$1, 6$a$2, 4$b$1, 4$b$2, 5$b$1, 5$b$2, 6$b$1, and 6$b$2, and is connected to at least a single motor 8. The control unit 7 generates and outputs a Pulse Width Modulation (hereinafter, referred to as "PWM") signal for controlling the switching elements 4$a$1, 4$a$2, 5$a$1, 5$a$2, 6$a$1, 6$a$2, 4$b$1, 4$b$2, 5$b$1, 5$b$2, 6$b$1, and 6$b$2. An example of the motor 8 connected to the inverter circuit 3 is an induction motor or a synchronous motor.

One end of the input circuit 2 is connected through a current collector 51 to an overhead contact line 50, while the opposite end of the input circuit 2 is connected through wheels 53 to a rail 52 that is at an earth potential. Direct-current power or alternating-current power supplied from the overhead contact line 50 is supplied to an input terminal of the input circuit 2 through the current collector 51, and power generated at an output terminal of the input circuit 2 is supplied to the inverter circuit 3.

The switching element 4$a$1 and the switching element 4$b$1 of the inverter circuit 3 are a positive switching element and a negative switching element, respectively. The switching element 4$a$1 and the switching element 4$b$1 are connected in series to each other and define a U-phase first leg. Likewise, the switching element 4$a$2 and the switching element 4$b$2, which are a positive switching element and a negative switching element, respectively, are connected in series to each other and define a U-phase second leg. The positive switching elements are also referred to as "positive arm" or "upper arm". The negative switching elements are also referred to as "negative arm" or "lower arm". The U-phase first leg is represented as "U1", while the U-phase second leg is represented as "U2".

The same applies to a V-phase and a W-phase. The V-phase and the W-phase are described below in the same manner as the U-phase. The switching element 5$a$1 and the switching element 5$b$1 are connected in series to each other and define a V-phase first leg. The switching element 5$a$2 and the switching element 5$b$2 are connected in series to each other and define a V-phase second leg. The switching element 6$a$1 and the switching element 6$b$1 are connected in series to each other and define a W-phase first leg. The switching element 6$a$2 and the switching element 6$b$2 are connected in series to each other and define a W-phase second leg. Similarly to the U-phase, the V-phase first leg is represented as "V1", while the V-phase second leg is represented as "V2". Likewise, the W-phase first leg is represented as "W1", while the W-phase second leg is represented as "W2".

The inverter circuit 3 is a three-phase inverter circuit in which the first leg and the second leg for each phase are connected in parallel to each other. It is preferable that the switching elements 4$a$1, 4$a$2, 5$a$1, 5$a$2, 6$a$1, 6$a$2, 4$b$1, 4$b$2, 5$b$1, 5$b$2, 6$b$1, and 6$b$2 are MOSFETs (Metal-Oxide-Semiconductor Field-Effect Transistors) or IGBTs (Insulated Gate Bipolar Transistors) in which diodes connected in inverse-parallel are incorporated.

The control unit 7 executes PWM control on the switching elements 4$a$1, 4$a$2, 5$a$1, 5$a$2, 6$a$1, 6$a$2, 4$b$1, 4$b$2, 5$b$1, 5$b$2, 6$b$1, and 6$b$2 of the inverter circuit 3 by using a PWM signal. The PWM control executed by the control unit 7 allows the inverter circuit 3 to convert a direct-current voltage applied from the input circuit 2 to any alternating-current voltage at any frequency and apply the alternating-current voltage to the motor 8, thereby driving the motor 8.

Meanwhile, in a case where a switching element chip is mounted, if the chip area is increased, the yield of the chips removed from the wafer is decreased. In contrast, if the chip area is decreased, this yield can be improved. Particularly, in a case where switching elements (hereinafter referred to as "SiC elements") formed from Silicon Carbide (SiC) are used, it is desirable to decrease the chip area in order to reduce the chip cost because the wafers are very costly. For this reason, in a case where SiC elements are used, the inverter circuit 3 of FIG. 1, which includes the parallel-connected two legs for each phase, is more advantageous for the cost reduction than an inverter circuit 3A of FIG. 2 which includes a single leg for each phase. That is, in large-capacitance applications such as a power conversion device for driving a railway vehicle, the legs for each phase are connected in parallel as illustrated in FIG. 1. This makes it possible to achieve a reduction in the cost of the power conversion device.

SiC is an example of wide bandgap semiconductors having wider bandgap properties than Silicon (Si). A semiconductor formed from a gallium nitride-based material or from diamond, which is another example of the wide bandgap semiconductors, also has similar properties to SiC in many respects. For this reason, even when a different type of wide bandgap semiconductor other than SiC is used, the configuration in which the legs for each phase are connected in parallel is still effective to achieve both the large capacitance and the cost reduction.

Figure 3:
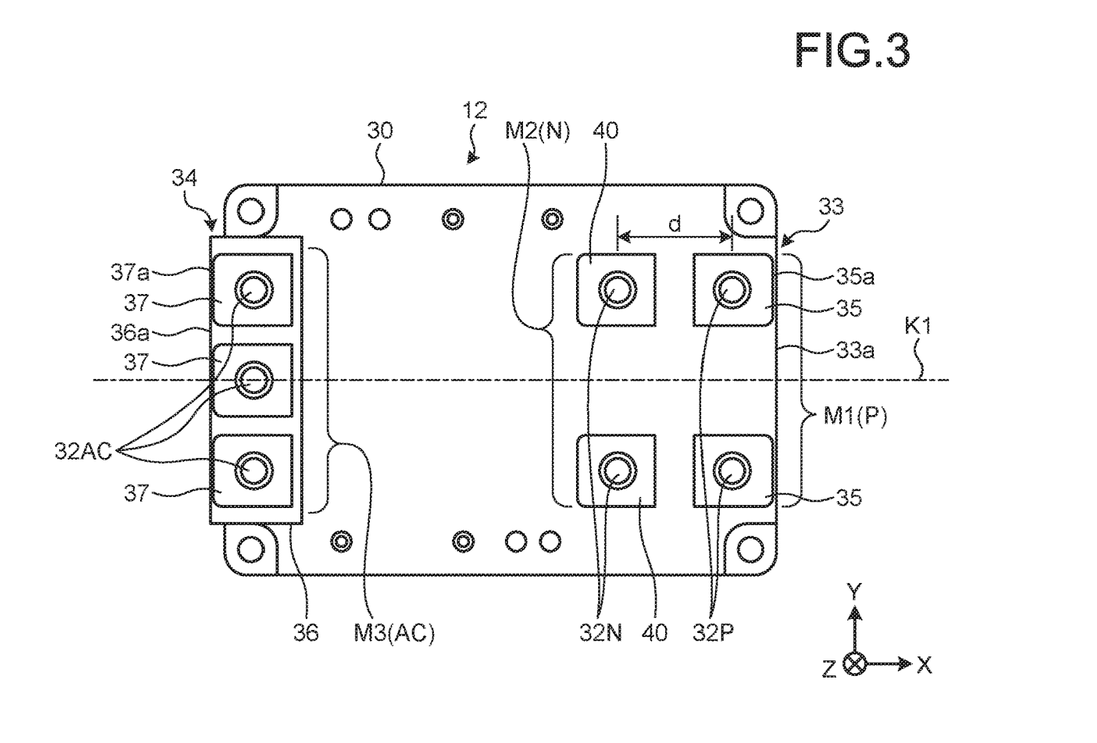
FIG. 3 is a plan view illustrating the location of individual terminals in a semiconductor element module used in the power conversion device according to the first embodiment.
Figure 4:
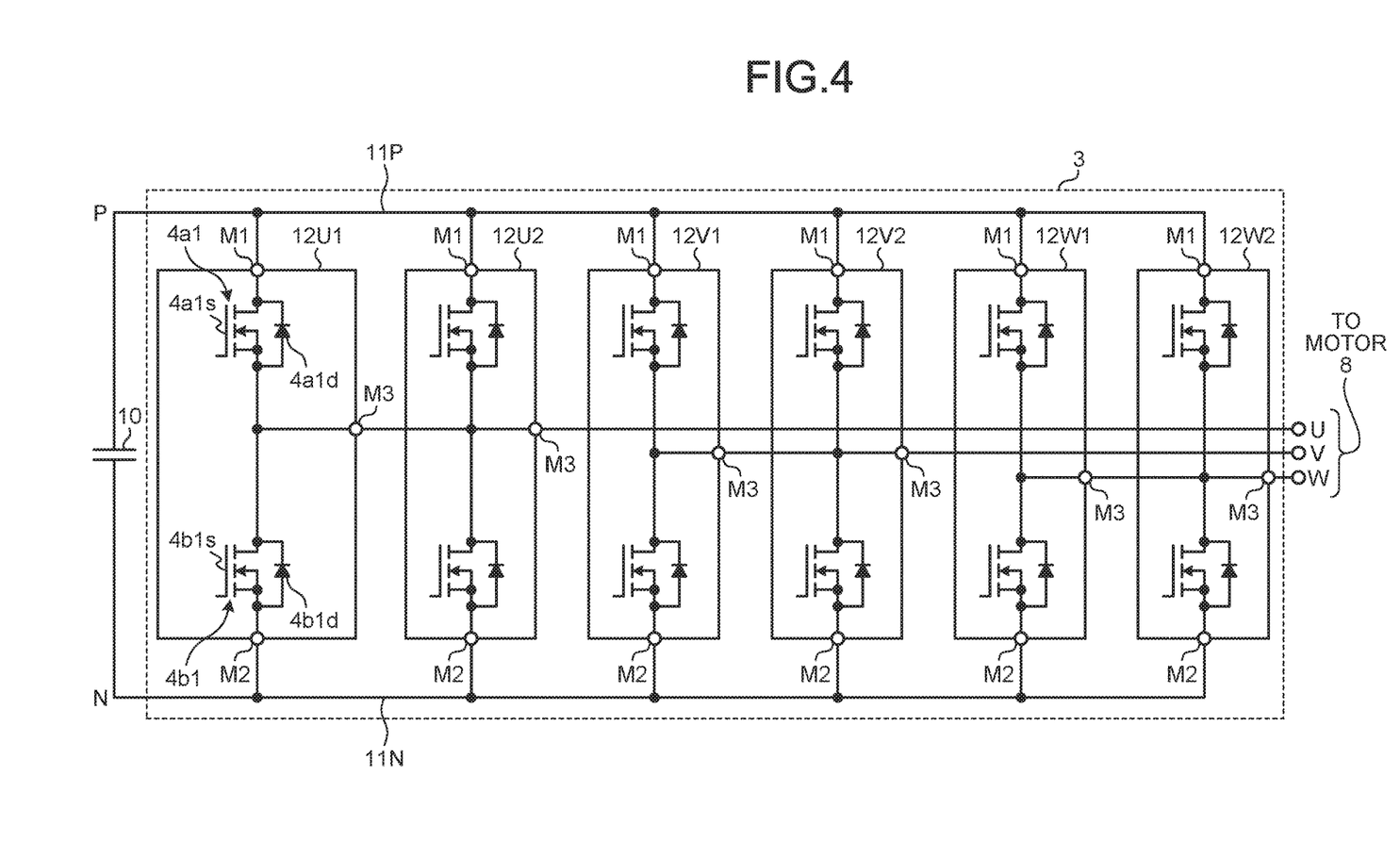
FIG. 4 is a circuit diagram of an inverter circuit illustrated in FIG. 1 to which the semiconductor element module illustrated in FIG. 3 is applied.

FIG. 3 is a plan view illustrating the location of individual terminals of a semiconductor element module 12 used in the power conversion device according to the first embodiment. FIG. 4 is a circuit diagram of the inverter circuit 3 illustrated in FIG. 1 to which the semiconductor element module 12 illustrated in FIG. 3 is applied.

The semiconductor element module 12 used in the power conversion device according to the first embodiment includes a package 30 that is a module casing. Although not illustrated in FIG. 3, the semiconductor element module 12 has a pair of semiconductor switching elements connected in series to each other inside the package 30.

FIG. 3 illustrates the package 30 on the left-handed coordinate axes, in which the longitudinal direction of the package 30 is defined as an X-axis direction, the shorter-side direction of the package 30 is defined as a Y-axis direction, and the direction perpendicular to both the X-axis direction and the Y-axis direction is defined as a Z-axis direction. As illustrated in FIG. 3, in the package 30, a first terminal M1 and a second terminal M2 are provided closer to one end surface of the package 30 in the X-axis direction. In the package 30, also, a third terminal M3 is provided closer to the other end surface. The first terminal M1 constitutes a positive direct-current terminal P that is one of the main terminals of the semiconductor element module 12. The second terminal M2 constitutes a negative direct-current terminal N that is another one of the main terminals of the semiconductor element module 12. The third terminal M3 constitutes an alternating-current terminal AC that is the other one of the main terminals of the semiconductor element module 12.

In FIG. 4, a semiconductor element module 12U1 applied to a U1-phase includes the switching element 4a1, and the switching element 4b1. The switching element 4a1 is constituted by a MOSFET 4a1s and a diode 4a1d connected in inverse parallel to the MOSFET 4a1s. The MOSFET 4a1s is illustrated as an example of a transistor element. The diode 4a1d operates as what is called a Free Wheeling Diode (hereinafter, represented to as "FWD"). The switching element 4b1 is constituted by a MOSFET 4b1s and a FWD 4b1d, which are connected in inverse parallel to each other. The switching element 4a1 and the switching element 4b1 are connected in series to each other and accommodated in the package 30 that is the module casing. The switching elements 4a1 and 4b1 constitute a switching element pair of the semiconductor element module 12U1. Likewise, a semiconductor element module 12U2 applied to a U2-phase is configured identically to the semiconductor element module 12U1. Likewise, semiconductor element modules 12V1, 12V2, 12W1, and 12W2 that are applied to a V1-phase, a V2-phase, a W1-phase, and a W2-phase, respectively, are also configured identically to the semiconductor element module 12U1. As described above, each of the semiconductor element modules 12U1, 12U2, 12V1, 12V2, 12W1, and 12W2 is a two-in-one module in which the two switching elements connected in series to each other are accommodated.

A drain, which is a positive electrode of the MOSFET 4a1s, is electrically connected to the first terminal M1. A source, which is a negative electrode of the MOSFET 4b1s, is electrically connected to the second terminal M2. A source that is a negative electrode of the MOSFET 4a1s and a drain that is a positive electrode of the MOSFET 4b1s are electrically connected to the third terminal M3. The first terminals M1 of the semiconductor element modules 12U1, 12U2, 12V1, 12V2, 12W1, and 12W2 are electrically connected to a positive busbar 11P extending from the positive direct-current terminal P of the filter capacitor 10. The second terminals M2 of the semiconductor element modules 12U1, 12U2, 12V1, 12V2, 12W1, and 12W2 are electrically connected to a negative busbar 11N extending from the negative direct-current terminal N of the filter capacitor 10. The filter capacitor 10 is a capacitor that accumulates therein direct-current power needed for power conversion, and serves as a power supply source of the power conversion device.

The third terminal M3 of the semiconductor element module 12U1 and the third terminal M3 of the semiconductor element module 12U2 are electrically connected to each other and form a U-phase alternating-current terminal electrically connected to the U-phase of the motor 8. The third terminal M3 of the semiconductor element module 12V1 and the third terminal M3 of the semiconductor element module 12V2 are electrically connected to each other and form a V-phase alternating-current terminal electrically connected to the V-phase of the motor 8. The third terminal M3 of the semiconductor element module 12W1 and the third terminal M3 of the semiconductor element module 12W2 are electrically connected to each other and form a W-phase alternating-current terminal electrically connected to the W-phase of the motor 8.

As described above, the semiconductor element modules 12U1, 12U2, 12V1, 12V2, 12W1, and 12W2 are mounted on the inverter circuit 3 and operate. When the inverter circuit 3 operates, a potential output by the positive direct-current terminal P of the filter capacitor 10 is applied to the first terminal M1 of each semiconductor element module, and a potential output by the negative direct-current terminal N of the filter capacitor 10 is applied to the second terminal M2 of each semiconductor element module. Either a potential output by the positive direct-current terminal P of the filter capacitor 10 or a potential output by the negative direct-current terminal N of the filter capacitor 10 is applied to the third terminal M3 of each semiconductor element module through a switched-on switching element in accordance with the switching operation of the switching elements.

Although the switching elements 4a1 and 4b1 mounted on the semiconductor element module 12U1 are, by way of example, MOSFETs In FIG. 4, the switching elements 4a1 and 4b1 may be a different type of switching elements other than the MOSFETs. Examples of the switching elements other than the MOSFETs include an IGBT and an IPM (Intelligent Power Module).

Referring back to FIG. 3, the configuration of each terminal of the semiconductor element module 12 is described. The package 30 of the semiconductor element module 12 is formed in a horizontally long shape. The first terminal M1 is provided with two electrodes 35. Each of the electrodes 35 is provided with a fastening point 32P. The second terminal M2 is provided with two electrodes 40. Each of the electrodes 40 is provided with a fastening point 32N. The third terminal M3 is provided with three electrodes 37. Each of the electrodes 37 is provided with a fastening point 32AC. Providing a plurality of such fastening points for electrodes of the first terminal M1, the second terminal M2, and the third terminal M3 achieves an advantage that current shunting among the chips inside the module is improved, thereby reducing imbalance in heat generated within the module. In FIG. 3, the number of the fastening points 32P at the electrodes 35 of the first terminal M1 is two, the number of the fastening points 32N at the electrodes 40 of the second terminal M2 is two, and the number of the fastening points 32AC at the electrodes 37 of the third terminal M3 is three, but the number of these fastening points may be changed in accordance with the current capacitance. That is, the number of the fastening points 32P of the first terminal M1 may be three or more, and the number of the fastening points 32N of the second terminal M2 may be three or more. Further, the number of the fastening points 32AC of the third terminal M3 may be either two or more than three.

The package 30 has a shorter-side portion 33 defining one side thereof in the X-axis direction. The two electrodes 35 of the first terminal M1, which are located at the shorter-side portion 33 of the package 30, are arranged and spaced apart from each other in the Y-axis direction of the package 30. The two electrodes 40 of the second terminal M2, which are arranged in parallel to the direction of arrangement of the two electrodes 35 of the first terminal M1, are located more inwardly, that is, closer to the central portion of the package 30 than the first terminal M1 is. The package 30 also has a shorter-side portion 34 defining the opposite side thereof in the X-axis direction. The three electrodes 37 of the third terminal M3, which are located at the shorter-side portion 34, are arranged and spaced apart from each other in the Y-axis direction of the package 30. These arranged electrodes of the first terminal M1, the second terminal M2, and the third terminal M3 are symmetric with respect to a center line K1 interconnecting the center of the shorter-side portion 33 of the package 30 in the Y-axis direction and the center of the shorter-side portion 34 of the package 30 in the Y-axis direction.

One electrode 35 of the first terminal M1 and one electrode 40 of the second terminal M2 are spaced apart from each other by a distance d in the X-axis direction. The distance d is an insulation distance, that is, a distance needed for insulation. The distance d, which is a value set in compliance with IEC60077-1, corresponds to a difference between a voltage applied to the first terminal M1 and a voltage applied to the second terminal M2, that is, a potential difference between the first terminal M1 and the second terminal M2.

The two fastening points 32P of the first terminal M1 are disposed in such a manner that one side 35a located outside the fastening point 32P is close to and along one side 33a of the shorter-side portion 33 defining the one side of the package 30. Further, provided on the shorter-side portion 34 defining the opposite side of the package 30 is a seat portion 36 on which the three fastening points 32AC of the third terminal M3 are mounted. The three fastening points 32AC of the third terminal M3 are disposed in such a manner that one side 37a located outside the fastening point 32AC is close to and along one longitudinal side 36a of the seat portion 36.

The two electrodes 35 of the first terminal M1 and the three electrodes 37 of the third terminal M3 are configured in the manner as described above, thereby eliminating the need for an increase in the size of the package 30 that is a casing of the semiconductor element module 12. Further, such a configuration makes it possible to secure an area for mounting the semiconductor elements accommodated in the package 30.

Although, in FIG. 3, the first terminal M1 is located on the outer side of the package 30 while the second terminal M2 is located on the inner side of the package 30, the positional relation between the first terminal M1 and the second terminal M2 may be opposite. That is, the second terminal M2 may be located on the outer side of the package 30, while the first terminal M1 may be located on the inner side of the package 30.

Figure 5:
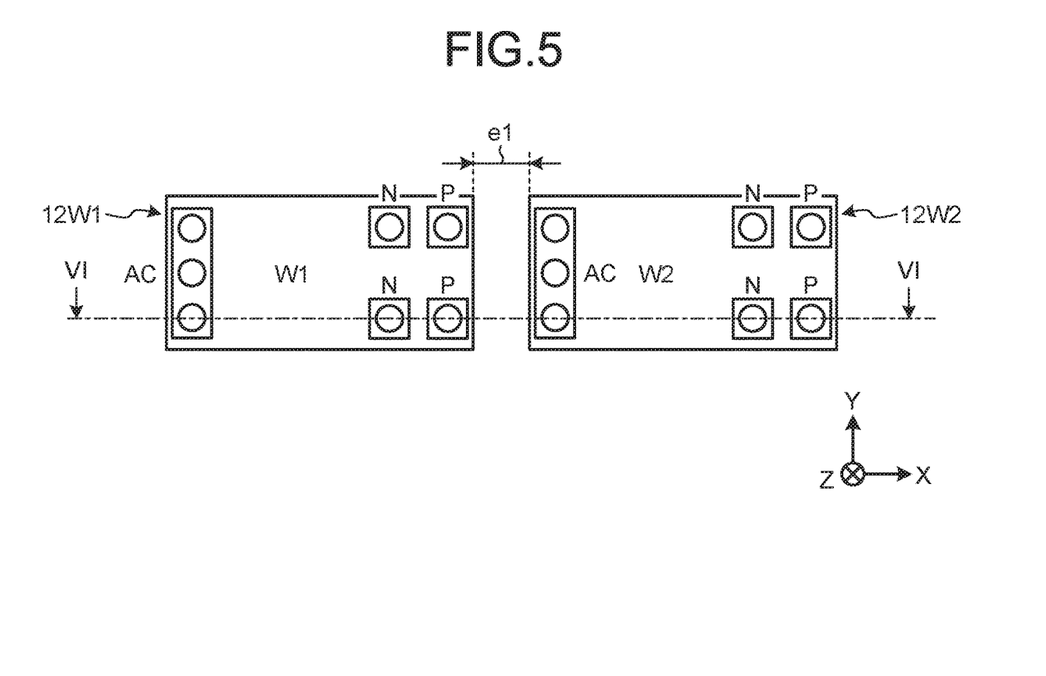
FIG. 5 is a plan view schematically illustrating an example of the location of two semiconductor element modules of the power conversion device according to the first embodiment.
Figure 6:
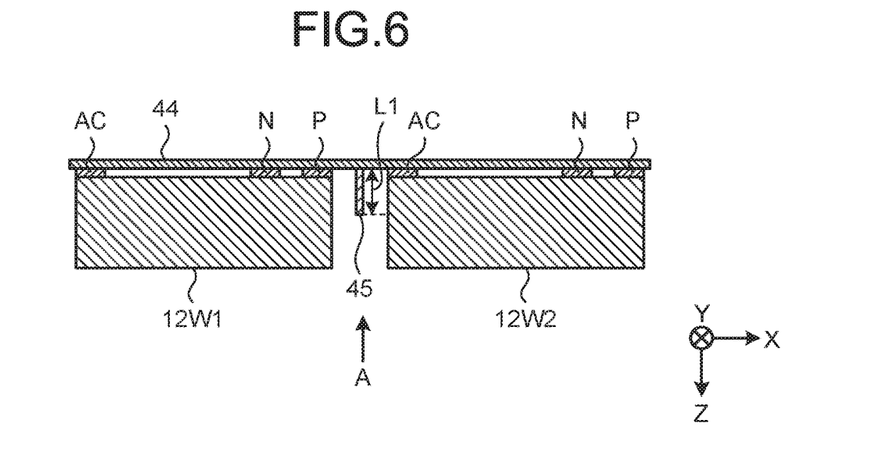
FIG. 6 is a cross-sectional diagram taken along line VI-VI in FIG. 5, and schematically illustrates connection between the semiconductor element modules and a wiring member according to the first embodiment.
Figure 7:
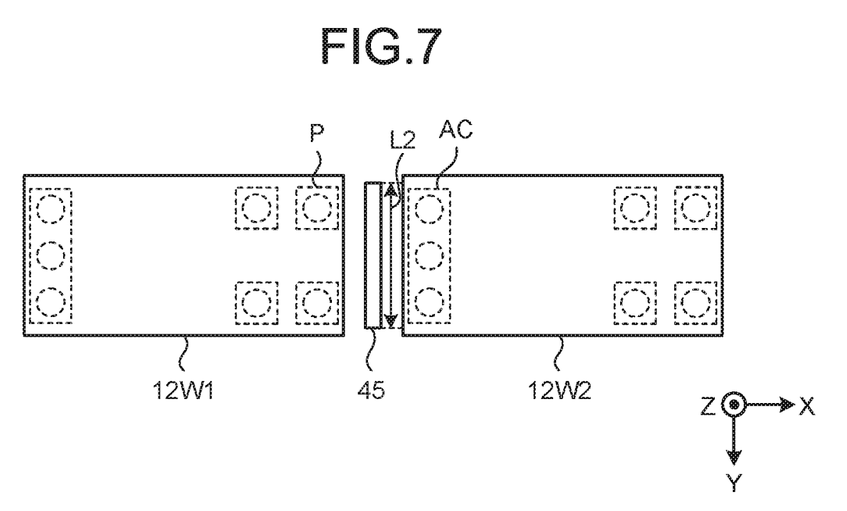
FIG. 7 is a plan view as viewed in a direction of an arrow A of FIG. 6.
Figure 8:
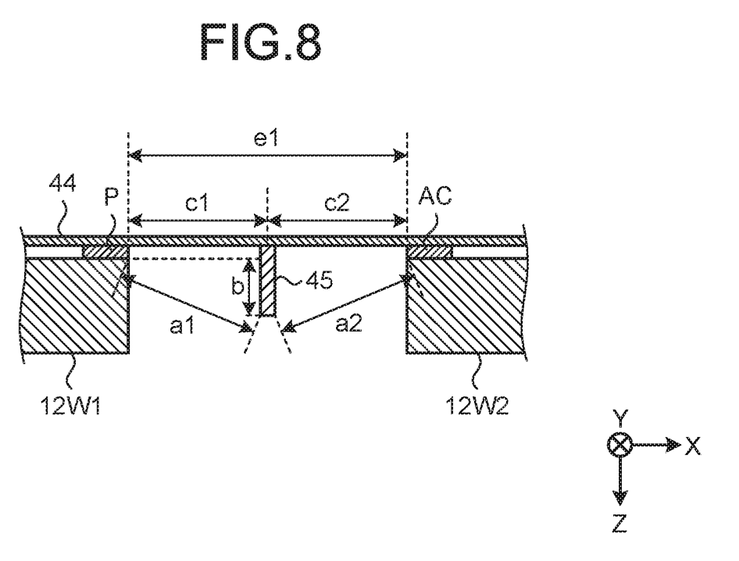
FIG. 8 is a diagram used for explaining the effect of the wiring member according to the first embodiment.
Figure 9:
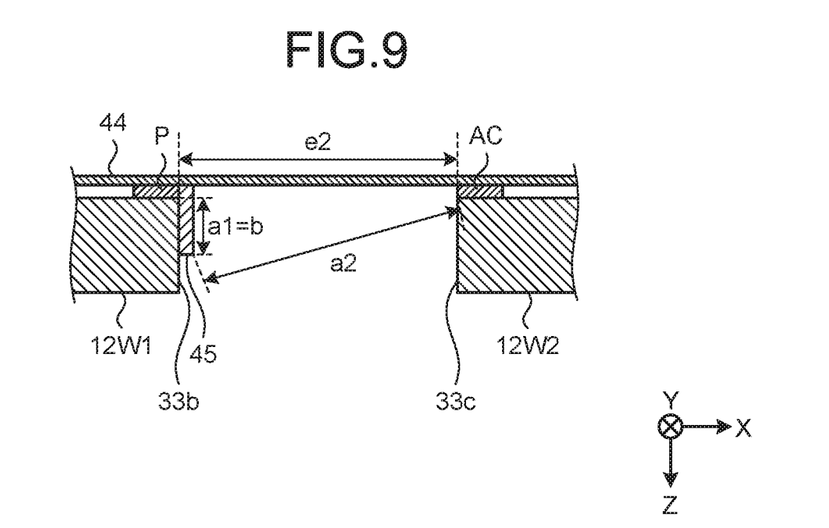
FIG. 9 is a diagram used for explaining the effect of a wiring member different from the wiring member in FIG. 6.

Next, configurations of relevant parts of the wiring member and the power conversion device according to the first embodiment are described with reference to FIGS. 5 to 9. FIG. 5 is a plan view schematically illustrating an example of the location of the two semiconductor element modules of the power conversion device according to the first embodiment. FIG. 6 is a cross-sectional diagram taken along line VI-VI in FIG. 5, and schematically illustrates connection between the semiconductor element modules and a laminate busbar that is the wiring member according to the first embodiment. FIG. 7 is a plan view as viewed in a direction of an arrow A of FIG. 6. FIG. 8 is a diagram used for explaining the effect of the wiring member according to the first embodiment. FIG. 9 is a diagram used for explaining the effect of a wiring member different from the wiring member in FIG. 6.

FIG. 5 illustrates the semiconductor element module 12W1 that constitutes the W1-phase, and the semiconductor element module 12W2 that constitutes the W2-phase. In FIG. 5, in the semiconductor element modules 12W1 and 12W2, the first terminal M1 that forms a positive direct-current terminal is represented as "P", the second terminal M2 that forms a negative direct-current terminal is represented as "N", and the third terminal M3 that forms an alternating-current terminal is represented as "AC".

In FIG. 5, the semiconductor element modules 12W1 and 12W2 are arranged in such a manner that the positive direct-current terminals P of the semiconductor element module 12W1 and the alternating-current terminals AC of the semiconductor element module 12W2 are disposed face-to-face. The semiconductor element modules 12W1 and 12W2 are semiconductor element modules for the same phase. That is, the positive direct-current terminals P of one of the two semiconductor element modules defining the semiconductor element modules for the same phase is disposed face-to-face with the alternating-current terminals AC of the other one of these two semiconductor element modules. Although FIG. 5 omits illustrations of the U-phase and V-phase semiconductor element modules, these U-phase and V-phase semiconductor element modules are located in the same manner as the W-phase semiconductor element modules. For example, assume that a W-phase semiconductor element module group is defined as being formed by the W-phase semiconductor element modules 12W1 and 12W2 and a U-phase semiconductor element module group and a V-phase semiconductor element module group are defined as in the W-phase semiconductor element module group. The two semiconductor element modules of each of the U-phase and V-phase semiconductor element module groups are arranged in the X-axis direction that is the same direction as the direction of the arrangement of the semiconductor element modules 12W1 and 12W2. The U-phase semiconductor element module group and the V-phase semiconductor element module group are arranged in the Y-axis direction perpendicular to the direction of the arrangement of the semiconductor element modules 12W1 and 12W2.

FIG. 6 schematically illustrates a state in which the positive direct-current terminals P of the semiconductor element modules 12W1 and 12W2 are electrically connected to each other by a wiring member 44, the negative direct-current terminals N of the semiconductor element modules 12W1 and 12W2 are electrically connected to each other by the wiring member 44, and the alternating-current terminals AC of the semiconductor element modules 12W1 and 12W2 are electrically connected to each other by the wiring member 44. The wiring member 44 is formed in a flat-plate shape. An example of the wiring member 44 is a laminate busbar. Formed on the wiring member 44 is an insulative partition 45 extending in a direction perpendicular to the direction of extension of the wiring member 44. The insulative partition 45 is formed in a flat-plate shape. As illustrated in FIGS. 6 and 7, the insulative partition 45 is interposed between the positive direct-current terminals P of the semiconductor element module 12W1 and the alternating-current terminals AC of the semiconductor element module 12W2, and is disposed so as to block the line of sight between these terminals. Any type of material may be used for the insulative partition 45 as long as the material is an insulating material. In a case where a laminate busbar is used as the wiring member 44 and the type of material of the insulative partition 45 is a laminate material, it is possible to form the insulative partition 45 integrally with the wiring member 44. The insulative partition 45 is not limited to having a flat-plate shape illustrated in FIG. 6. The insulative partition 45 having any shape may be used.

In FIG. 6, the insulative partition 45 is disposed at any position in the X-axis direction of the wiring member 44. That is, the insulative partition 45 may be disposed at any position between the semiconductor element module 12W1 and the semiconductor element module 12W2. It is required that a length L1 of the insulative partition 45 in the Z-axis direction be greater than a thickness of the positive direct-current terminal P in the Z-axis direction and a thickness of the alternating-current terminal AC in the Z-axis direction. The insulative partition 45 need not extend in a direction at an angle of 90 degrees relative to the direction of the extension of the wiring member 44, but may incline relative to the direction of the extension of the wiring member 44. In FIG. 7, it is required that a length of the insulative partition 45 in a depth direction, that is, a length L2 along the shorter-side direction of the semiconductor element modules 12W1 and 12W2 be so large that the positive direct-current terminals P and the alternating-current terminals AC cannot be directly viewed from each other.

In application of the power conversion device to driving a railway vehicle, the positive direct-current terminals P of the semiconductor element module 12W1 are the main terminals to which a positive potential that is a first potential output by the filter capacitor 10 is applied. In contrast, the alternating-current terminals AC of the semiconductor element module 12W2 are the main terminals to which the positive potential of the filter capacitor 10 and a negative potential that is a second potential output by the filter capacitor 10 are appropriately applied in accordance with whether one switching element and the other switching element which constitute a switching element pair are switched on or off. Thus, the positive direct-current terminals P and the alternating-current terminals AC are related to each other such that a high-voltage potential difference can occur therebetween. In the following descriptions, the terminals between which a high-voltage potential difference can occur are sometimes referred to as "high-voltage different potential terminals". One of the high-voltage different potential terminals is sometimes referred to as "first main terminal", while the other of the high-voltage different potential terminals is sometimes referred to as "second main terminal". One of the semiconductor element modules, which corresponds to the semiconductor element module 12W1, is sometimes referred to as "first semiconductor element module", while the other semiconductor element module, which corresponds to the semiconductor element module 12W2, is sometimes referred to as "second semiconductor element module". The negative direct-current terminals N and the alternating-current terminals AC also have a relation as referred to as the high-voltage different potential terminals. The positive direct-current terminals P and the negative direct-current terminals N also have a relation as referred to as the high-voltage different potential terminals.

Next, a description is made with reference to FIG. 8 as to making the distance between the semiconductor element modules smaller than an insulation distance due to the wiring member according to the first embodiment. In FIG. 8, a section between the positive direct-current terminal P and the alternating-current terminal AC is illustrated as being enlarged in the horizontal direction. What are meant by reference sings in FIG. 8 is as follows.

a1: Distance between the positive direct-current terminal P of the semiconductor element module 12W1 and the top of the insulative partition 45 a2: Distance between the alternating-current terminal AC of the semiconductor element module 12W2 and the top of the insulative partition 45 b: Height of the insulative partition 45 measured from the main surfaces of the semiconductor element modules 12W1 and 12W2 c1: Distance along the wiring member 44 between the edge of the positive direct-current terminal P and the base portion of the insulative partition 45 c2: Distance along the wiring member 44 between the edge of the alternating-current terminal AC and the base portion of the insulative partition 45 e1: Distance between the semiconductor element module 12W1 and the semiconductor element module 12W2

Additional explanations are given to the above descriptions. The main surfaces of the semiconductor element modules 12W1 and 12W2 are electrode mounting surfaces of the semiconductor element modules 12W1 and 12W2. The base portion of the insulative partition 45 is a section of the wiring member 44 on which the insulative partition 45 is mounted. As illustrated in FIG. 6, when the insulative partition 45 is formed, "a1+a2" is the shortest distance between the positive direct-current terminal P of the semiconductor element module 12W1 and the alternating-current terminal AC of the semiconductor element module 12W2. Thus, by setting the value of "a1+a2" equal to or greater than the insulation distance defined in IEC60077-1, it is possible to ensure that the insulation complies with IEC60077-1. The distances e1, c1, and c2 have the relation "e1=c1+c2" thereamong. The distance e1 is hereinafter referred to as "module-to-module distance".

As understood from FIG. 8, where the length L1 of the insulative partition 45 defined in FIG. 6 is greater than the thickness of the positive direct-current terminal P and the thickness of the alternating-current terminal AC, there is the relation "a1+a2>c1+c2". This relation indicates that the module-to-module distance e1 is shorter than the insulation distance a1+a2. The relation expressed by the statement "the length L1 of the insulative partition 45 is greater than the thickness of the positive direct-current terminal P and the thickness of the alternating-current terminal AC" is rephrased as the statement that the height b of the insulative partition 45 defined in FIG. 8 is defined as "b>0".

Next, specific examples are explained. The following examples describe calculation values obtained when the value of "a1+a2" is set as the insulation distance.

Setting Example 1

(Conditions)
Insulation distance a1+a2: 40 mm
Height b of the insulative partition 45: 10 mm
Position of the insulative partition 45: Center between the positive direct-current terminal P and the alternating-current terminal AC
(Calculation Values)
Module-to-module distance e1: 34.6 mm
Reduction rate k1: 0.87

Setting Example 2

(Conditions)
Insulation distance a1+a2: 40 mm
Length of a1 of the insulation distance: 25 mm
Length of a2 of the insulation distance: 15 mm
Height b of the insulative partition 45: 10 mm
(Calculation Values)
Module-to-module distance e1: 34.1 mm
Length of c1 of the module-to-module distance: 22.9 mm
Length of c2 of the module-to-module distance: 11.2 mm Reduction rate k1: 0.85

The reduction rate k1 of the above calculation values is a value calculated using an equation k=e1/(a1+a2). The reduction rate k1 is an indicator indicating how much the module-to-module distance is reduced relative to the insulation distance. A smaller value of the reduction rate k1 indicates a greater reduction effect.

It can be understood from the calculation results in Setting Examples 1 and 2 described above that a greater reduction effect is produced when the insulative partition 45 is located off the center between the positive direct-current terminal P and the alternating-current terminal AC than when the insulative partition 45 is located at the center.

Next, shown below are the calculation results obtained when the insulative partition 45 is located in contact with a side portion 33b of the semiconductor element module 12W1 as illustrated in FIG. 9.

Setting Example 3

(Conditions)
Insulation distance a1+a2: 40 mm
Length of a1 of the insulation distance: 10 mm
Length of a2 of the insulation distance: 30 mm
Height b of the insulative partition 45: 10 mm
Position of the insulative partition 45: Left end of the distance between the positive direct-current terminal P and the alternating-current terminal AC
(Calculation Values)
Module-to-module distance e2: 28.3 mm
Reduction rate k1: 0.71

It is understood from the calculation results in Setting Examples 1 to 3 that the value of the reduction rate k1 becomes smaller as the insulative partition 45 is located closer to the side portion 33b of the semiconductor element module 12W1 or to a side portion 33c of the semiconductor element module 12W2. However, in practice, it is necessary to take into account the factors such as dimensional accuracy in manufacturing the insulative partition 45 and an insulation effect produced by air interposed between the insulative partition 45 and the module casing. Any of Setting Examples 1 to 3 provides an effect of reducing a module-to-module distance relative to an insulation distance. Therefore, it is considered preferable that the position of the insulative partition 45 is determined taking into account the factors such as dimensional accuracy in manufacturing the insulative partition 45 and an insulation distance needed.

Shown below are calculation values obtained when the height b of the insulative partition 45 is increased from the height b set in Setting Examples 1 to 3. In the following calculation examples, the height b of the insulative partition 45 among the conditions in Setting Examples 1 to 3 described above is changed from "10 mm" to "12 mm".

Setting Example 4

(Conditions)
Insulation distance a1+a2: 40 mm
Height b of the insulative partition 45: 12 mm
Position of the insulative partition 45: Center between the positive direct-current terminal P and the alternating-current terminal AC
(Calculation Values)
Module-to-module distance e1: 32.0 mm
Reduction rate k1: 0.80

Setting Example 5

(Conditions)
Insulation distance a1+a2: 40 mm
Length of a1 of the insulation distance: 25 mm
Length of a2 of the insulation distance: 15 mm
Height b of the insulative partition 45: 12 mm
(Calculation Values)
Module-to-module distance e1: 30.9 mm
Length of c1 of the module-to-module distance: 21.9 mm
Length of c2 of the module-to-module distance: 9.0 mm
Reduction rate k1: 0.77

Setting Example 6

(Conditions)
Insulation distance a1+a2: 40 mm
Length of a1 of the insulation distance: 12 mm
Length of a2 of the insulation distance: 28 mm
Height b of the insulative partition 45: 12 mm
Position of the insulative partition 45: Left end of the space between the positive direct-current terminal P and the alternating-current terminal AC
(Calculation Values)
Module-to-module distance e2: 25.3 mm
Reduction rate k1: 0.63

On the basis of the calculation results in Setting Examples 1 to 6, a reduction rate k2 is calculated under the same conditions when the height b of the insulative partition 45 has been changed from "10 mm" to "12 mm". The following results are then obtained.

Comparison between Setting Example 1 and Setting Example 4: k2=0.80/0.870.92
Comparison between Setting Example 2 and Setting Example 5: k2=0.77/0.850.91
Comparison between Setting Example 3 and Setting Example 6: k2=0.63/0.710.89

The above results indicate that an effect of approximately 10% decrease is achieved by increasing the height b of the insulative partition 45 only by 2 mm. Therefore, it is considered effective to increase the height b of the insulative partition 45 in order to reduce the module-to-module distance. The above setting examples are merely an example. The height of the insulative partition 45 is not limited to the height set in those setting examples.

As described above, it is possible to downsize the power conversion device because the use of the wiring member according to the first embodiment makes the distance between the main terminals of the semiconductor element modules shorter than an insulation distance.

Second Embodiment

Figure 10:
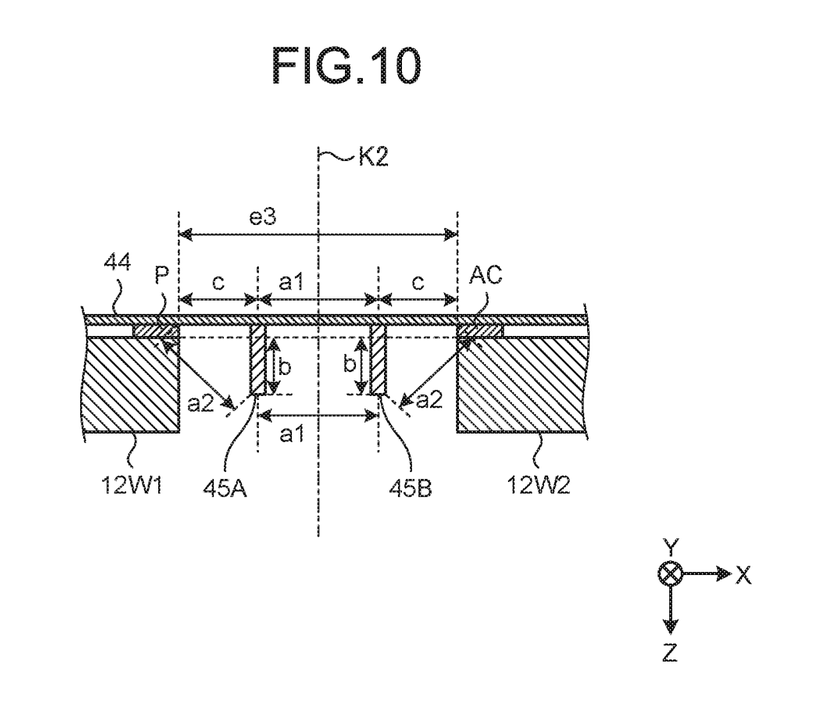
FIG. 10 is a diagram used for explaining the effect of a wiring member according to a second embodiment.
Figure 11:
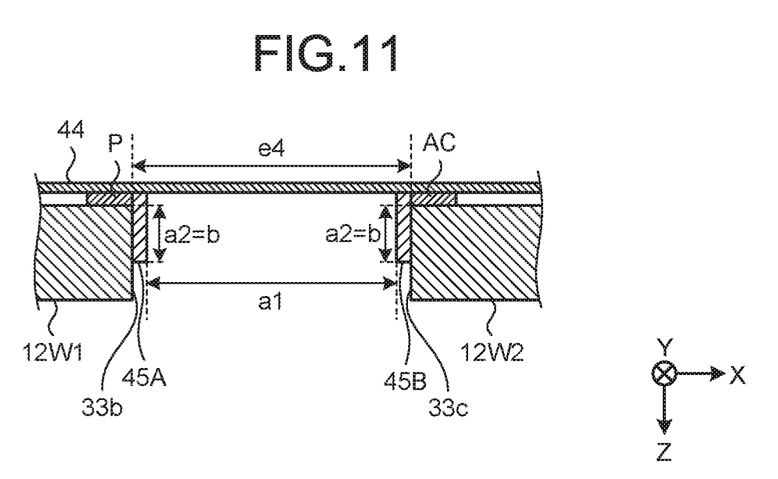
FIG. 11 is a diagram used for explaining the effect of a wiring member different from the wiring member in FIG. 10.

Next, configurations of relevant parts of a wiring member according to a second embodiment are described with reference to FIGS. 10 and 11. FIG. 10 is a diagram used for explaining the effect of the wiring member according to the second embodiment. FIG. 11 is a diagram used for explaining the effect of a wiring member different from the wiring member in FIG. 10.

In the first embodiment, a single insulative partition 45 is formed in a direction perpendicular to the direction of the extension of the wiring member 44. The second embodiment is different in structure from the first embodiment in that two insulative partitions 45A and 45B are formed as illustrated in FIG. 10. In FIG. 11, the insulative partition 45A is disposed along the side portion 33b of the semiconductor element module 12W1, while the insulative partition 45B is disposed along the side portion 33c of the semiconductor element module 12W2.

What are meant by reference sings in FIGS. 10 and 11 is as follows. For simplicity of calculation, FIG. 10 illustrates an example in which the insulative partitions 45A and 45B are disposed symmetrically about a center line K2 extending between the semiconductor element module 12W1 and the semiconductor element module 12W2.

a1: Distance between the top of the insulative partition 45A and the top of the insulative partition 45B a2: Distance between the positive direct-current terminal P of the semiconductor element module 12W1 and the top of the insulative partition 45A, and distance between the alternating-current terminal AC of the semiconductor element module 12W2 and the top of the insulative partition 45B b: Height of each of the insulative partitions 45A and 45B measured from the main surface of the corresponding one of the semiconductor element modules 12W1 and 12W2 c: Distance along the wiring member 44 between the edge of the positive direct-current terminal P and the base portion of the insulative partition 45A, and distance along the wiring member 44 between the edge of the alternating-current terminal AC and the base portion of the insulative partition 45B e3: Module-to-module distance The module-to-module distance e3, the distance a1, and the distance c have the relation "e3=a1+2×c" thereamong.

Next, shown below are specific calculation values obtained when an insulation distance is set to the value of "a1+2×a2". The reduction rate k1 shown below is a value calculated using an equation k=e3/(a1+2×a2).

Setting Example 7

(Conditions)
Insulation distance a1+2×a2: 40 mm
Length of a1 of the insulation distance: 10 mm
Length of a2 of the insulation distance: 15 mm
Height b of each of the insulative partitions 45A and 45B: 5 mm
(Calculation Values)
Module-to-module distance e3: 38.3 mm
Length of c of the module-to-module distance: 14.15 mm
Reduction rate k1: 0.84

Setting Example 8

(Conditions)
Insulation distance a1+2×a2: 40 mm
Length of a1 of the insulation distance: 10 mm
Length of a2 of the insulation distance: 15 mm
Height b of each of the insulative partitions 45A and 45B: 10 mm
(Calculation Values)
Module-to-module distance e3: 32.4 mm
Length of c of the module-to-module distance: 11.2 mm
Reduction rate k1: 0.81

Setting Example 9

(Conditions)
Insulation distance a1+2×a2: 40 mm
Length of a1 of the insulation distance: 30 mm
Length of a2 of the insulation distance: 5 mm
Height b of each of the insulative partitions 45A and 45B: 5 mm Position of the insulative partition 45A: Left end of the space between the positive direct-current terminal P and the alternating-current terminal AC
Position of the insulative partition 45B: Right end of the space between the positive direct-current terminal P and the alternating-current terminal AC
(Calculation Values)
Module-to-module distance e4: 30.0 mm
Reduction rate k1: 0.75

Setting Example 10

(Conditions)
Insulation distance a1+2×a2: 40 mm
Length of a1 of the insulation distance: 10 mm
Length of a2 of the insulation distance: 15 mm
Height b of the insulative partitions 45A and 45B: 10 mm
Position of the insulative partition 45A: Left end of the space between the positive direct-current terminal P and the alternating-current terminal AC
Position of the insulative partition 45B: Right end of the space between the positive direct-current terminal P and the alternating-current terminal AC
(Calculation Values)
Module-to-module distance e4: 20.0 mm
Reduction rate k1: 0.5

The calculation results in Setting Examples 7 and 8 and Setting Examples 9 and 10 described above show that increasing the height b of the insulative partitions 45A and 45B produces a greater reduction effect. The calculation results in Setting Examples 7 and 9 and Setting Examples 8 and 10 described above show that a greater reduction effect is produced by bringing the location of the insulative partition 45A close to the side portion 33b of the semiconductor element module 12W1, and the location of the insulative partition 45B close to the side portion 33c of the semiconductor element module 12W2. These effects are identical to the case of the first embodiment.

Further, comparison between the calculation results in Setting Example 1 according to the first embodiment and the calculation results in Setting Example 8 according to the second embodiment, and comparison between the calculation results in Setting Example 3 according to the first embodiment and the calculation results in Setting Example 10 according to the second embodiment reveal that a greater reduction effect can be produced by increasing the number of insulative partitions.

Note that, in the first and second embodiments described above, application of the wiring member to the semiconductor element modules 12 used in the three-phase inverter circuit as illustrated in FIG. 1 or FIG. 2 has been described; however, the application of the wiring member is not limited thereto. The wiring member is applicable to a power conversion device using at least two semiconductor element modules. Examples of the power conversion device as described above can include a half-bridge inverter circuit, a single-phase inverter circuit, a chopper circuit, a single-phase converter circuit, and a three-phase converter circuit.

The configurations described in the above embodiments are only examples of the content of the present invention. The configurations can be combined with other well-known techniques, and part of each of the configurations can be omitted or modified without departing from the scope of the present invention.

REFERENCE SIGNS LIST

2 input circuit, 3, 3A inverter circuit, 4a1, 4a2, 4b1, 4b2, 5a1, 5a2, 5b1, 5b2, 6a1, 6a2, 6b1, 6b2 switching element, 7 control unit, 8 motor, 10 filter capacitor, 11P positive busbar, 11N negative busbar, 12, 12U1, 12U2, 12V1, 12V2, 12W1, 12W2 semiconductor element module, 30 package, 32P, 32N, 32AC fastening point, 34 shorter-side portion, 33a, 35a, 36a, 37a side, 33b, 33c side portion, 35, 37, 40 electrode, 36 seat portion, 44 wiring member, 45, 45A, 45B insulative partition, 50 overhead wire, 51 current collector, 52 rail, 53 wheel, AC alternating-current terminal, N negative direct-current terminal, P positive direct-current terminal.

The invention claimed is:

1. A wiring member to electrically connect a first main terminal of a first semiconductor element module among a plurality of semiconductor modules having first and second main terminals and a first main terminal of a second semiconductor element module to each other, the second semiconductor element module being different from the first semiconductor element module, and electrically connect a second main terminal of the first semiconductor element module and a second main terminal of the second semiconductor element module to each other, a first potential being applied to the first main terminal, a second potential being applied to the second main terminal, the second potential being different from the first potential, the wiring member comprising
an insulative partition formed on the wiring member, the insulative partition being upright so as to block a line of sight between the first main terminal of the first semiconductor element module and the second main terminal of the second semiconductor element module, the first main terminal of the first semiconductor element module and the second main terminal of the second semiconductor element module being disposed face-to-face.

2. The wiring member according to claim 1, wherein the insulative partition is plural in number.

3. The wiring member according to claim 2, wherein the first main terminal of the first semiconductor element module is a positive direct-current terminal, and the second main terminal of the second semiconductor element module is an alternating-current terminal.

4. A power conversion device configured using the wiring member according to claim 3.

5. The wiring member according to claim 2, wherein the first main terminal of the first semiconductor element module is a positive direct-current terminal, and the second main terminal of the second semiconductor element module is a negative direct-current terminal.

6. A power conversion device configured using the wiring member according to claim 5.

7. The wiring member according to claim 2, wherein the first main terminal of the first semiconductor element module is an alternating-current terminal, and the second main terminal of the second semiconductor element module is a negative direct-current terminal.

8. A power conversion device configured using the wiring member according to claim 7.

9. A power conversion device configured using the wiring member according to claim 2.

10. The wiring member according to claim 1, wherein the first main terminal of the first semiconductor element module is a positive direct-current terminal, and the second main terminal of the second semiconductor element module is an alternating-current terminal.

11. A power conversion device configured using the wiring member according to claim 10.

12. The wiring member according to claim 1, wherein the first main terminal of the first semiconductor element module is a positive direct-current terminal, and the second main terminal of the second semiconductor element module is a negative direct-current terminal.

13. A power conversion device configured using the wiring member according to claim 12.

14. The wiring member according to claim 1, wherein the first main terminal of the first semiconductor element module is an alternating-current terminal, and the second main terminal of the second semiconductor element module is a negative direct-current terminal.

15. A power conversion device configured using the wiring member according to claim 14.

16. A power conversion device configured using the wiring member according to claim 1.

* * * * *